United States Patent [19]

Asano et al.

[11] Patent Number: 4,805,150
[45] Date of Patent: Feb. 14, 1989

[54] PROGRAMMABLE SEMICONDUCTOR MEMORY DEVICE HAVING GROUPED HIGH VOLTAGE SUPPLY CIRCUITS FOR WRITING DATA

[75] Inventors: Masami Asano, Tokyo; Hiroshi Iwahashi, Yokohama, both of Japan

[73] Assignee: Kabushiki Kaisha Toshiba, Kawasaki, Japan

[21] Appl. No.: 813,237

[22] Filed: Dec. 24, 1985

[30] Foreign Application Priority Data

Dec. 25, 1984 [JP]  Japan ................................ 59-278407
Dec. 25, 1984 [JP]  Japan ................................ 59-278408

[51] Int. Cl.$^4$ ................... G11C 8/00; G11C 7/00; H03F 3/45
[52] U.S. Cl. .................................. 365/230; 365/226; 307/530
[58] Field of Search ............... 365/189, 226, 227, 228, 365/230, 231, 240; 307/530

[56] References Cited

U.S. PATENT DOCUMENTS

| | | | |
|---|---|---|---|
| 4,467,457 | 8/1984 | Iwahashi et al. | 365/228 |
| 4,531,202 | 7/1985 | Watanabe et al. | 365/226 |
| 4,549,102 | 10/1985 | Segawa et al. | 365/227 |
| 4,601,020 | 7/1986 | Arakawa et al. | 365/226 |
| 4,616,143 | 10/1986 | Miyamoto | 365/226 |
| 4,627,027 | 12/1986 | Rai et al. | 365/189 |
| 4,653,026 | 3/1987 | Komori et al. | 365/230 |
| 4,686,651 | 11/1984 | Armstrong et al. | 365/226 |

FOREIGN PATENT DOCUMENTS 0029716 6/1981 European Pat. Off. .
0114504 8/1984 European Pat. Off. .
2094086A 9/1982 United Kingdom .

OTHER PUBLICATIONS

"High-Voltage Regulation and Process Considerations for High-Density 5 V-Only E$^2$PROM's", Oto et al., 8107.
IEEE Journal of Solid-State Circuits, vol. SC-18, No. 5 New York, USA; pp. 532-538.

Primary Examiner—Terrell W. Fears
Assistant Examiner—Melissa J. Koval
Attorney, Agent, or Firm—Finnegan, Henderson, Farabow, Garrett, & Dunner

[57] ABSTRACT

In a programmable semiconductor memory device, a plurality of transistors operated as switches are provided, one switch transistor for each row and/or column lines. These switch transistors are divided into a plurality of groups. One terminal of each switch transistor is connected to the corresponding row and/or column line. A plurality of high voltage supply circuits are provided, one for each switch transistor group. A supplemental decoder is employed to select the switch transistor connected to the row and/or column line selected by a row and/or column decoder, to turn the selected switch transistor on so that the selected row and/or column line is supplied with a high voltage from the high voltage supply cirucit corresponding to the group including the selected switch transistor.

9 Claims, 13 Drawing Sheets

FIG. 3A  $\phi_1$
(PRIOR ART)

FIG. 3B  $\phi_2$
(PRIOR ART)

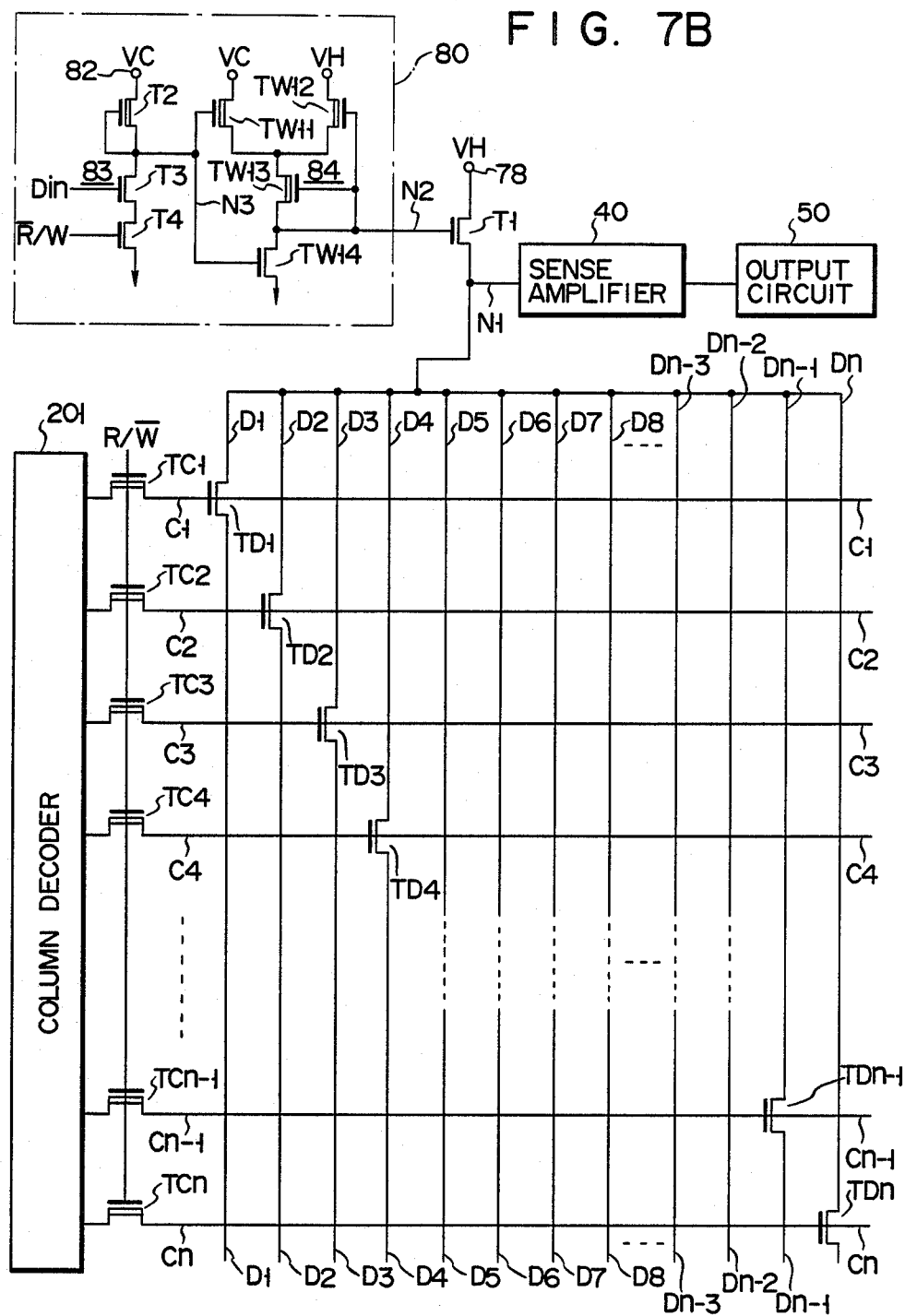

PROGRAMMABLE SEMICONDUCTOR MEMORY DEVICE HAVING GROUPED HIGH VOLTAGE SUPPLY CIRCUITS FOR WRITING DATA

BACKGROUND OF THE INVENTION

This invention relates to a nonvolatile semiconductor memory device using nonvolatile memory cells.

Electrically erasable and programmable read only memories (EEPROM) or erasable and programmable read only memory (EPROM) using nonvolatile memory cells have long been known. Each of the memory cells has a double layered gate structure comprising a floating gate and a control gate. Data can be electrically written into and erased from the memory cells.

Each nonvolatile memory cell can be structurally illustrated in the form of an MOS (metal oxide semiconductor) transistor, as shown in FIGS. 1A to 1D. In FIGS. 1A through 1D, 101 and 102 are source and drain regions, respectively. A floating gate electrode, denoted by 103, which is in an electrically floating state, is made of, for example, polycrystalline silicon. A control gate electrode, denoted by 104, is similarly made of, for example, polycrystalline silicon. A relatively thick insulating film of, for example, a silicon oxide film, exists between floating gate electrode 103 and semiconductor substrate 105, and between floating gate electrode 103 and control gate 104. Relatively thin insulating film 107 of, for example, a silicon oxide film, is formed on substrate 105, where floating gate electrode 103 closes drain region 102.

Data is set into the memory cell by injecting electrons into floating gate 103 of the cell. When electrons are injected into floating gate 103, the threshold value of the cell transistor is high. Consequently, even if a high voltage is applied to control gate 104, the transistor is not turned on. When electrons have been discharged from the memory cell, the cell transistor is turned on, providing a high voltage is applied to control gate 104. By detecting the on or off state of the cell transistor, "1" or "0" data of the cell is determined. To inject electrons into floating gate 103, a high voltage is applied to control gate 104. As a result of the application of this high potential, the potential at floating gate 103 is increased through the capacitor coupling between control gate 104 and floating gate 103. Then, electrons are injected from drain 102 into floating gate 103 through thin region 107 of insulating film 106. To discharge electrons from floating gate 103, control gate 104 is grounded, while drain region 102 is set to a high potential. In turn, electrons are discharged from floating gate 103 to drain region 102 through thin region 107 of insulating film 106.

The memory device comprises memory cells arranged in a matrix fashion. To write data into the selected cell, a high voltage must be selectively applied to the control gate electrode. To obtain the high voltage, some of the memory devices contain boost circuits. In this type of memory device, a power source voltage of 5V, for example, can be boosted to, for example, 20V. An example of such a boost circuit is shown in FIG. 2. Timing charts of pulse signals $\phi1$ and $\phi2$, used to control the operation of the boost circuit, are shown in FIGS. 3A and 3B.

The known boost circuit comprises a plurality of enhancement type MOS transistors 201 serving as diodes, and a plurality of capacitors 202. Under control of pulse signals $\phi1$ and $\phi2$, the boost circuit can boost a 5V power source voltage Vc to as high a voltage $V_H$ as 20V, for example. This 20V high voltage $V_H$, however, provides only a weak current. To selectively apply this voltage to the memory cells, no current must be fed from the boost circuit to the nonselected memory cells: those memory cells whose control gate electrodes are grounded. Instead, the boosted voltage must be applied to the selected memory cells. Such a data write circuit needs an increased number of circuit elements; hence its construction is complicated. Similarly, as the conventional memory device is provided with a data write circuit for each row or column line, the memory device contains a large number of elements. Consequently, when fabricating an integrated circuit, the resultant chip is large in size.

A circuit diagram of a conventional EPROM is shown in FIG. 4. Memory cells TM11 to TMmn, as MOS transistors of the double layered gate (floating and control gates) structure, are located at the cross points of row lines R1 to Rm and column lines D1 to Dn. The sources of memory cells TM11 to TMmn are all grounded. Memory cells TM11 to TMmn cooperate to form memory cell array 10.

Row lines R1 to Rm are connected to row decoder 20 through depletion type (D type) MOS transistors TR1 to TRm. Control signal $R/\overline{W}$ is applied to the gates of transistors TR1 to TRm to control data read/write. Row decoder 20 receives a row address signal (not shown) and selects one of the row lines accordingly, and sets the selected line to a high potential.

Column lines D1 to Dn are connected to signal detection node N1, through enhancement type (E type) MOS transistors TD1 to TDn. Sense amplifier 40 is connected to node N1. Output circuit 50 is connected to amplifier 40. A signal at node N1 is detected by amplifier 40 and output to the exterior through output circuit 50.

Column select lines C1 to Cn are connected to the gates of transistors TD1 to TDn, respectively. Lines C1 to Cn are connected to column decoder 60 through D type MOS transistors TC1 to TCn. Control signal $R/\overline{W}$ is applied to the gates of transistors TC1 to TCn. Decoder 60 selects one of column select lines C (generally designated as C1 to Cn) according to a column address signal, and sets it to a high potential.

Write circuit 70 selectively feeds high voltage $V_H$ to row line R (generally designates R1 to Rm) and column select line C. Voltage $V_H$ is for writing data, and is obtained by the voltage boost circuit of FIG. 2. Boosted voltage distributing circuits $71_1$ to $72m$, of a total of (n+m), are provided to correspond to column select lines C1 to Cn and row lines R1 to Rm. Circuits 71 and 72 (generally designated as $71_1$ to $71n$ and $72_1$ to $72m$) are each comprised of four D type MOS transistors TW1 to TW4, and one E type MOS transistor TW5, as typified by circuit $72_1$ which is connected to row line R1. The first ends of transistors TW1 and TW2 are connected to power source terminal 73, coupled with voltage $V_H$, and power source terminal 74, coupled with power source voltage Vc of, for example, 5V, respectively. The second ends of these transistors are connected together at node 75. Transistor TW3 is connected between node 75 and row line R1. The gates of both transistors TW1 and TW3 are connected together to row line R1. Transistors TW4 and TW5 are inserted in series between terminal 76, connected to voltage Vc, and the ground potential point. Connection point 77, between these transistors, is connected to the gates of transistors TW2 and TW4. The gate of transistor TW5 is connected to row line R1.

E type MOS transistor T1 is connected between node N1 and terminal 78 which is connected to voltage $V_H$. The gate of transistor T1 is supplied with a signal appearing at output node N2 of write data input control circuit 80.

Circuit 80 is comprised of power source terminal 82, NAND gate circuit 83, and voltage output control circuit 84. NAND gate 83 includes D type MOS transistor T2 and E type MOS transistors T3 and T4, which are connected in series between ground and power source terminal 82 which is connected to voltage Vc. Voltage output control circuit 84 includes D type transistors TW11 to TW13, and E type transistor TW14, and controls voltage $V_H$ according to a signal appearing at output node N3 of NAND gate circuit 83. In NAND gate circuit 83, the gate of transistor T2 is connected to its output node N3. The gate of transistor T3 is supplied with input data Din. The gate of transistor T4 is supplied with signal R/$\overline{W}$ which is set at level "1" in a write mode and at "0" in a read mode.

In the read mode of the EPROM thus arranged, signal R/$\overline{W}$ is set at high ("1") level, signal $\overline{R/W}$ at low ("0") level, and voltage $V_H$ at power source terminal 73 at 5V. When signal R/$\overline{W}$ is high in level, transistors TC1 to TCn, and transistors TR1 to TRm are turned on. When signal R/$\overline{W}$ is low, transistor T4 is turned off, the signal at output node N3 of NAND circuit 83 is set to high level, the signal at output node N2 of output control circuit 84 is set to low level, and transistor T1 is turned off.

Of row lines R1 to Rm and column select lines C1 to Cn, only those selected by row decoder 20 or column decoder 60 are set at high level. Then, memory cell Tm (generally designated as TM11 to TMmn) in memory cell array 10, located at this intersecting point, is selected. If no carriers are injected into selected memory cell TM, the memory cell is turned on, allowing current to flow between the drain and source. If carriers are injected into selected memory cell TM, the memory cell is turned off and signal detecting node N1 is set to high level by the load in sense amplifier 40. The signal at node N1 at this time is output to the exterior through sense amplifier 40 and output circuit 50.

When "1" level data is written into the cell, signal R/$\overline{W}$ is set to low level, signal $\overline{R/W}$ to high level, and voltage $V_{H\ 1\ to\ positive}$ 20V. At this time, if row line R1 and column select line C1, for example, are selected, the "1" level voltage is applied to row line R1 and column select line C1, through transistors TR1 and TC1. Then, boosted voltage distribution circuits $71_1$ and $72_2$, connected to row line R1 and column select line C1, produce high voltage $V_H$. Row line R1 and column select line C1 are charged up to 20V. As for other row line R and column select line C, the output signals which are derived from row decoder 20 and column decoder 60 are low in level, and boosted voltage distributing circuits 71 and 72 do not produce high voltage $H_H$. At this time, input data Din is set to high level. As a result, voltage Vc, having been supplied to power source terminal 82, appears at node N3. Therefore, output node N2 of voltage output control circuit 84 is set at $V_H$, so that transistor T1 is turned on. In turn, transistor TD1, controlled by column select line C1, is turned on to charge column line D1 with a high voltage. The high voltage is applied to the control gates of memory cell TM11, selected by row and column lines R1 and D1, and subsequently, to its drain, with the result that data of "1" level is written into memory cell TM11 by the injection of electrons caused by the tunnel effect. If input data Din is set to low level, the transistor T1 is turned off, so that high voltage is not applied to the drain of memory cell TM11. Accordingly, data of "1" level is not written into the cell (This operation is equivalent to the writing of "0" level into the cell).

When "1" level data has been written into a memory cell, it is retained unless erased. In this respect, the cell data is nonvolatile. The conventional non-volatile semiconductor memory device, however, needs boosted voltage distribution circuits for each row line and each column select line. This results in an increase in the number of circuit elements required for the memory device as a whole, resulting in reduction of packing density when the device is fabricated by IC technology.

SUMMARY OF THE INVENTION

Accordingly, an object of the present invention is to provide a nonvolatile semiconductor memory device in which the number of necessary circuit elements has been decreased to facilitate an improvement in packing density.

According to the invention, there is provided a nonvolatile semiconductor memory device comprising a plurality of row lines, a plurality of column lines, crossing said plurality of row lines to define intersections therebetween; a memory array comprising a plurality of memory cells, said plurality of memory cells being located on said intersections; a plurality of column selecting lines for selecting a plurality of said column lines; a first decoder for receiving an address signal and for selecting one of at least one of said row lines and said column selecting lines; high voltage supply circuits for providing a high voltage for writing data into said memory cells; a plurality of selecting elements, one terminal of each of said selecting elements constituting a group being connected to the other terminal of one of said high voltage supply circuits, and the other terminal of each of said selecting elements constituting said group being connected to one of said row lines and said column selecting lines; and a second decoder for receiving said address signal for selecting one of said plurality of said selecting elements.

BRIEF DESCRIPTION OF THE DRAWINGS

FIGS. 3A and 3B are waveforms of clock pulses;

FIGS. 7A to 7D are circuit diagrams of an EPROM according to another embodiment of the present invention.

DETAILED DESCRIPTION OF THE PREFERRED EMBODIMENTS

Figure 1A:
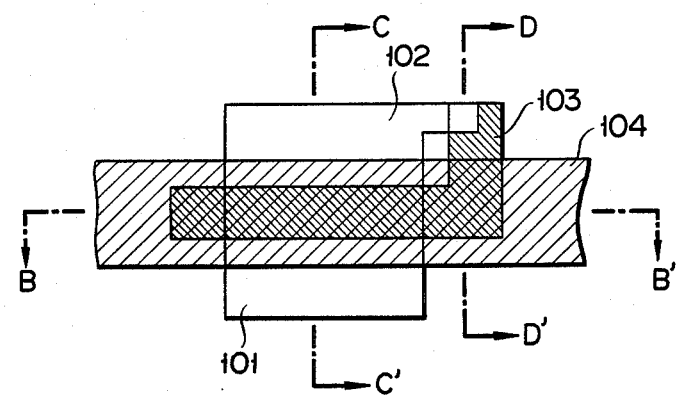
FIG. 1A is a plan view of a memory cell used in a nonvolatile semiconductor memory device.
Figure 1B:
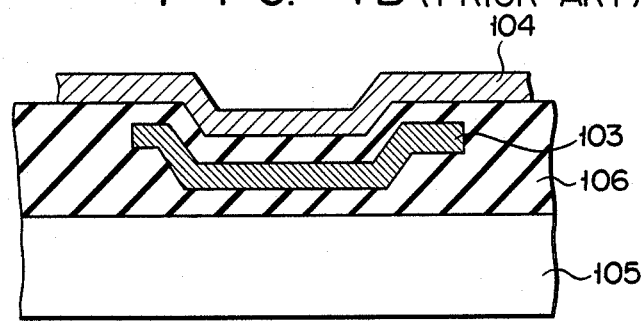
FIGS. 1B to 1D are cross sectional views taken on lines B—B, C—C and D—D in FIG. 1A.
Figure 1C:
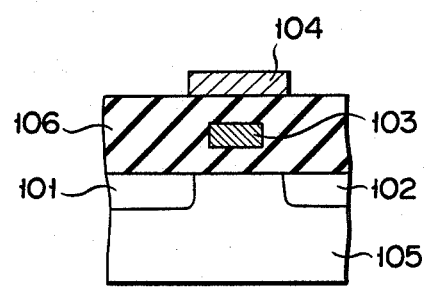
Figure 1D:
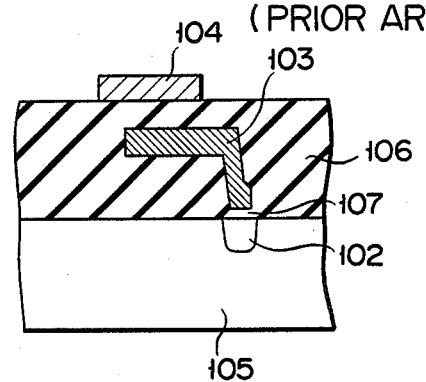
Figure 2:
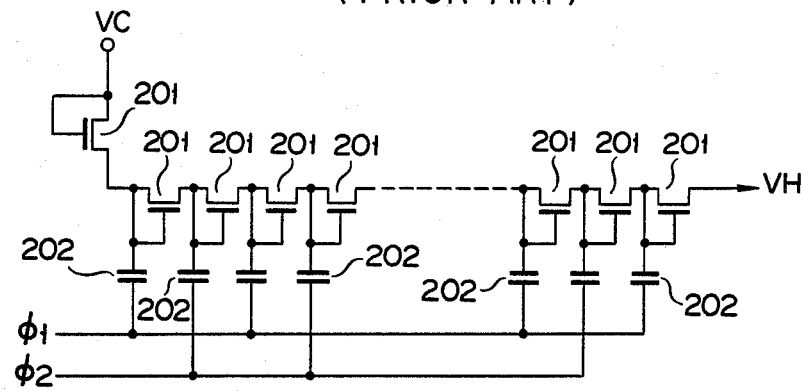
FIG. 2 is a circuit diagram of a boost circuit.
Figure 4:
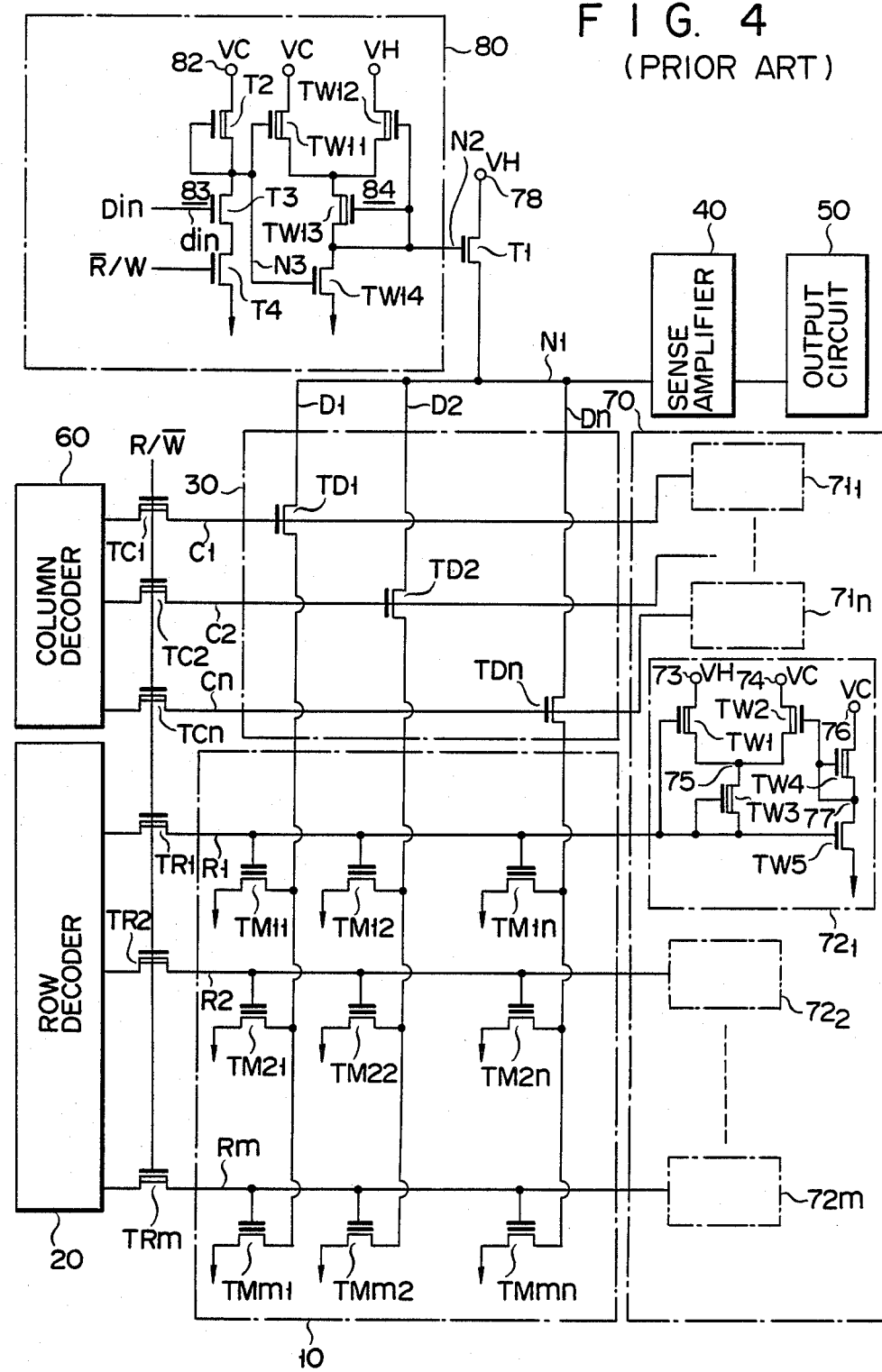
FIG. 4 is a diagram of a conventional EPROM.
Figure 5A:
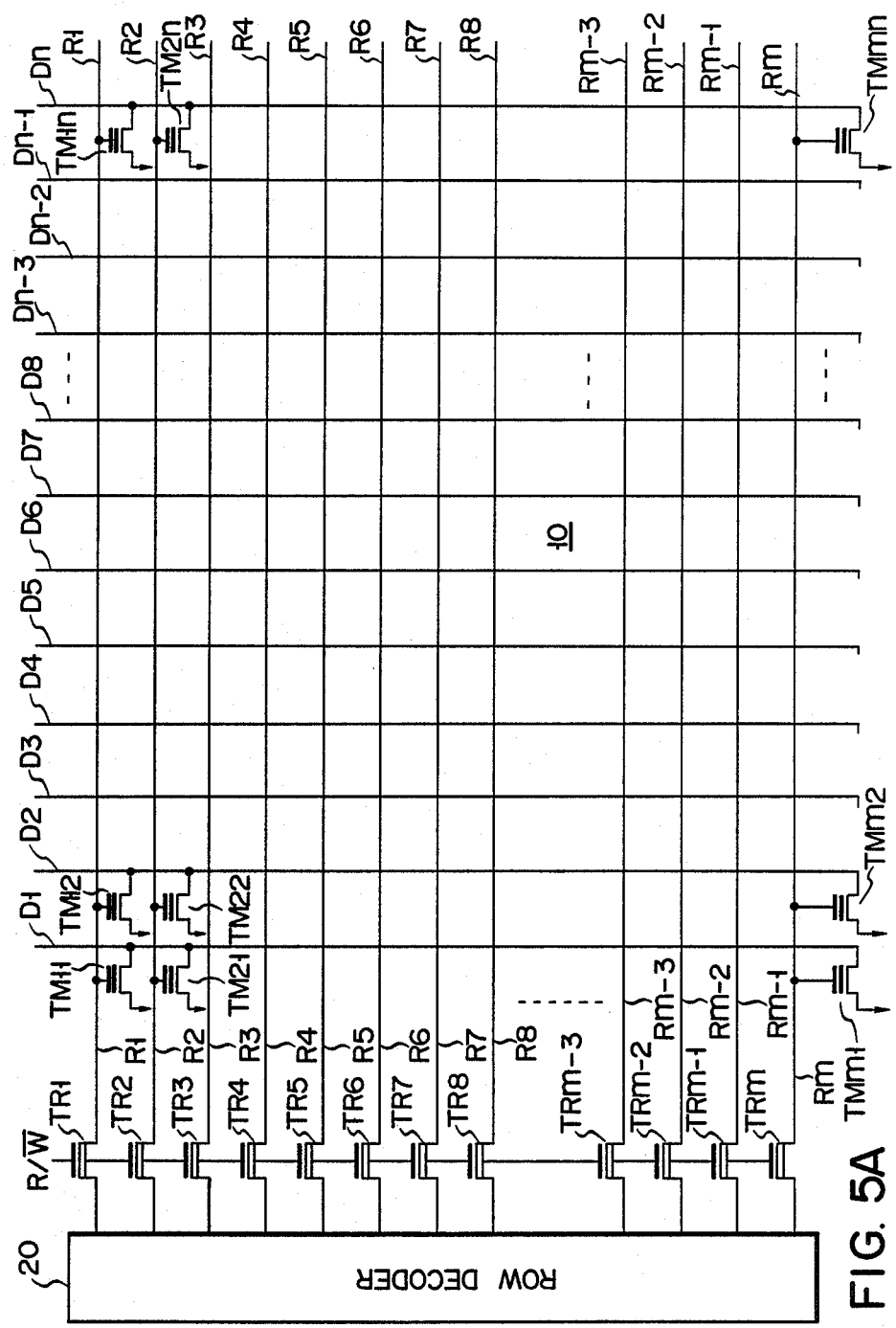
FIGS. 5A to 5D are circuit diagrams of an EPROM according to an embodiment of the present invention.
Figure 5B:
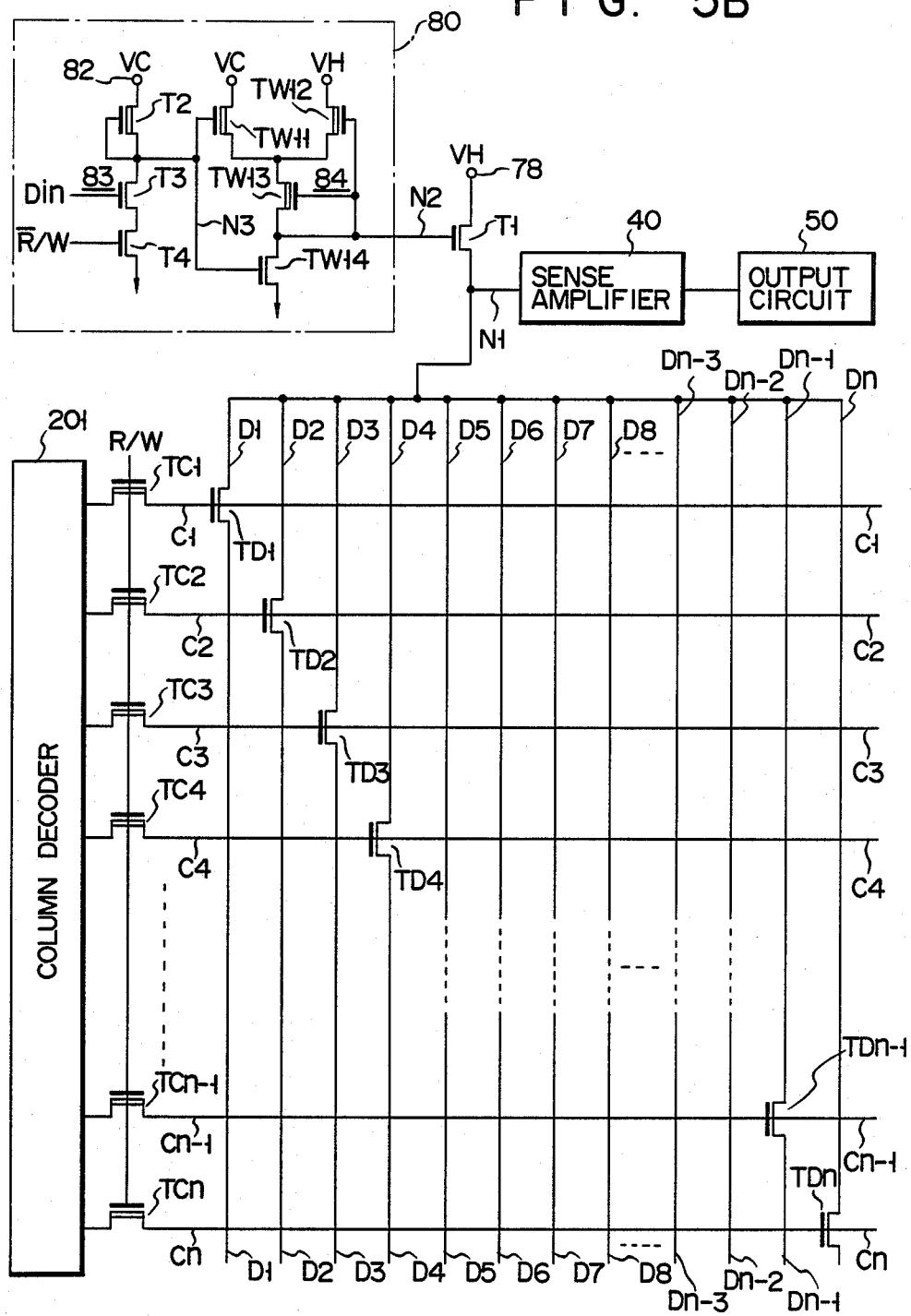
Figure 5C:
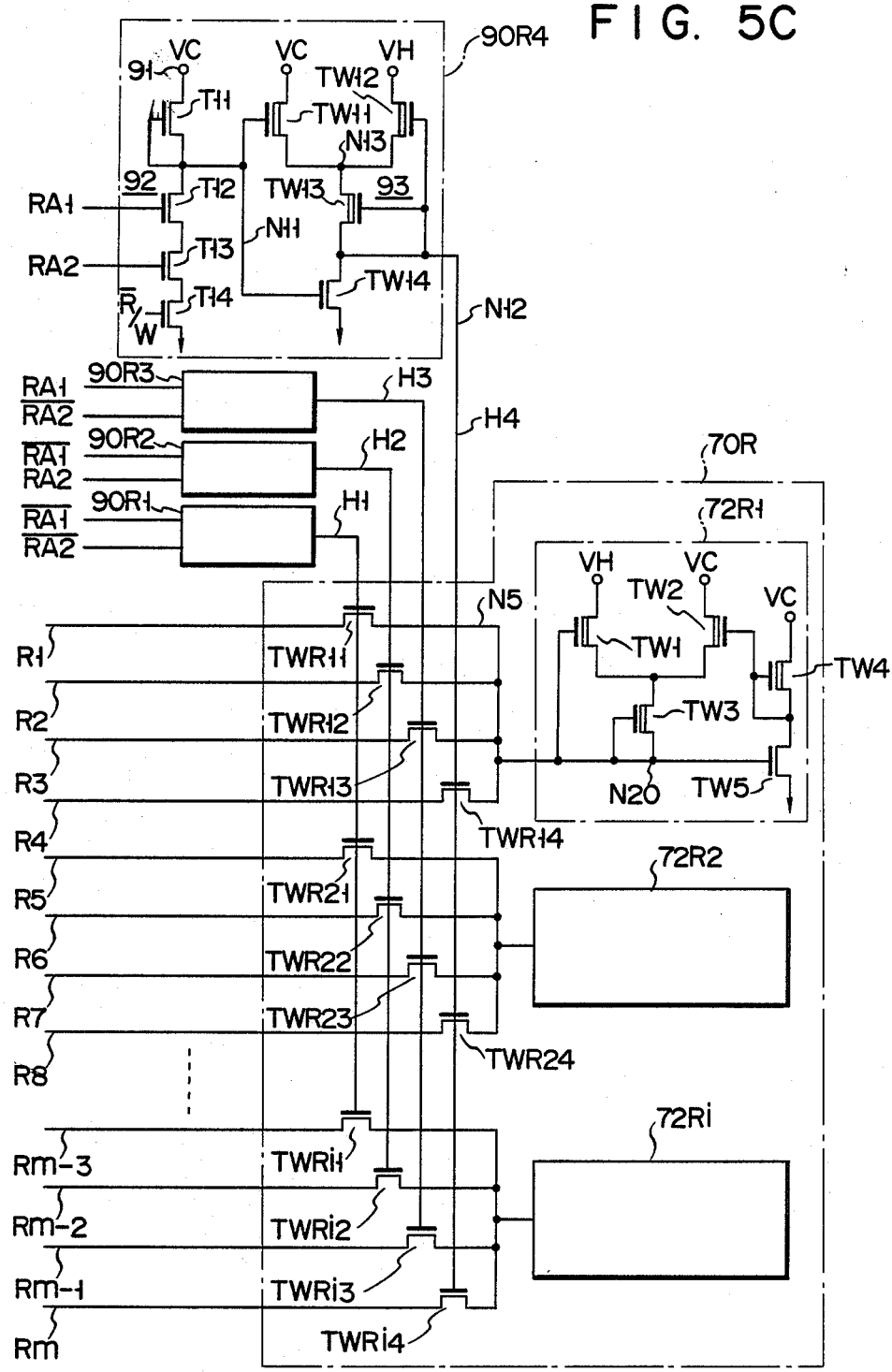
Figure 5D:
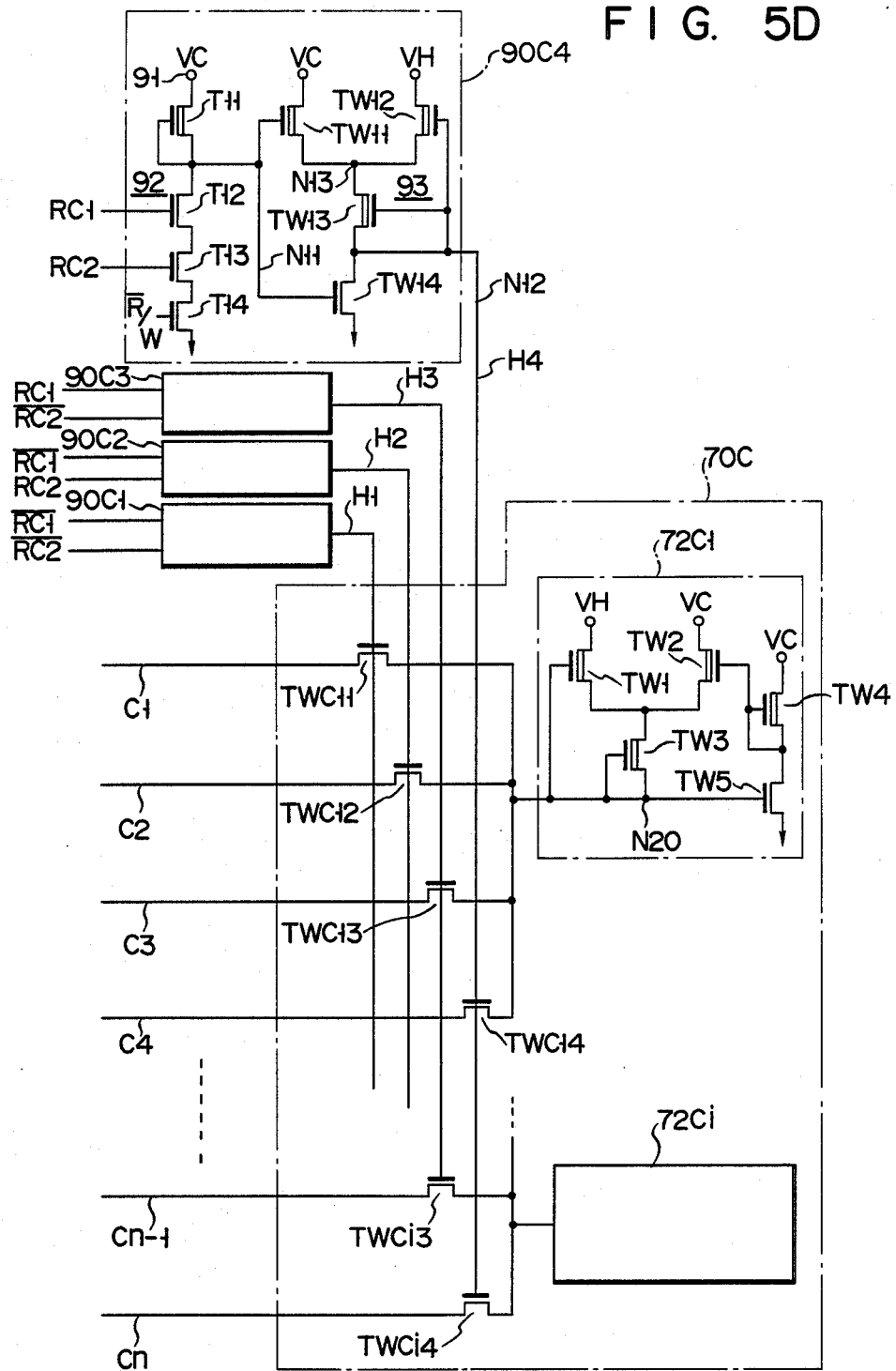

An EPROM according to an embodiment of the present invention will be described with reference to FIGS. 5A to 5D. This embodiment differs from the EPROM shown in FIG. 4 in the following respects. While the conventional circuit shown in FIG. 4 uses boosted voltage distribution circuits for each row line or each column select line, the circuit of this embodiment, shown in FIGS. 5A to 5D, uses one boosted voltage distribution circuit for four column select lines or four row lines. Further, decoders $90_1$ to $90_4$ are additionally provided.

In the EPROM shown in FIG. 5A to 5D, memory cells TM11 to TMmn—MOS transistors of a double gate (floating and control gates) structure—are located at the intersections of row lines R1 to Rm and column lines D1 to Dn. The sources of memory cells TM11 to TMmn are all grounded. Memory cells TM11 to TMmn cooperate to form memory cell array 10.

Row lines R1 to Rm are connected to row decoder 20 through depletion type (D type) MOS transistors TR1 to TRm. Control signal R/$\overline{W}$, for control of data read/write, is applied to the gate of transistors TR1 to TRm. Row decoder 20 receives a row address signal (not shown), selects one of the row lines according to the contents of the address signal, and sets the line at a high potential.

Column lines D1 to Dn are connected to signal detection node N1 through column selection enhancement type (E type) MOS transistors TD1 to TDn. Sense amplifier 40 is connected to node N1. Output circuit 50 is connected to amplifier 40. A signal at node N1 is detected by amplifier 40 and output to the exterior through output circuit 50.

Column select lines C1 to Cn are connected to the gates of transistors TD1 to TDn, respectively. Lines C1 to Cn are connected to column decoder 60 through D type MOS transistors TC1 to TCn. Control signal R/$\overline{W}$ is applied to the gates of transistors TC1 to TCn. Decoder 201 receives a column address signal (not shown), selects one of column select lines C (generally designated as C1 to Cn) according to the column address signal, and sets it to a high potential.

Write circuits 70R and 70C are used to supply high voltage Vp to row lines R and column lines C, when data is to be written into memory cells TM11 to TMmn.

Write circuit 70R comprises boosted voltage distributing circuits 72R1 to 72Ri. Of m row lines R1 to Rm, lines R1 to R4 are connected together to single boosted voltage distribution circuit 72R1 through node N5 and E type MOS transistors TWR11 to TWR14. Row lines R5 to R8 are connected together to boosted voltage distribution circuit 72R2 through E type MOS transistors TWR21 to TWR24. Similarly, four row lines R are connected together to one boosted voltage distribution circuit 72R through four E type MOS transistors TWR. Row lines Rm-3 to Rm are connected together to one boosted voltage distribution circuit 72Ri through E type MOS transistors TWRi1 to TWRi4.

The structure and operation of the boosted voltage distributing circuits 72C1 to 72Ci are substantially the same as those of boosted voltage distributing circuits 72R1 to 72Ri, except that circuits 72C1 to 72Ci are connected to groups of the four column select lines C1, C2, C3, C4; ...; $C_{n-3}$, $C_{n-2}$, $C_{n-1}$, Cn. Therefore, corresponding characters with the suffix C are employed, and the descriptions are omitted.

Signal H1, derived from decoder $90_1$, is applied to the gates of transistors TWR11, TWR21, ..., TWRi1. Similarly, signal H2, derived from decoder $90_2$, is applied to the gates of transistors TWR12, TWR22, ..., TWRi2. Signal H3, derived from decoder $90_3$, is connected to the gates of transistors TWR13, TWR23, ..., TWRi3. Signal H4, coming from decoder $90_4$, is applied to the gates of transistors TWR14, TWR24, ... TWRi4.

Decoders $90_1$ through $90_4$ have the same configurations. As typified by decoder $90_4$, each circuit comprises D type MOS transistor T11 for load, NAND gate circuit 92, and voltage output control circuit 93. The source-drain path of transistor T11 is inserted between power source terminal 91, coupled with voltage Vc, and node N11. The gate of transistor T11 is connected to node N11. E type MOS transistors T12 to T14 are connected in series between node N11 and ground potential. Two bit row address signals RA1 and RA2 are applied to the gates of transistors T12 and T13. Signal R/$\overline{W}$ is applied to the gate of transistor T14. This signal is in "0" level in the read mode and in "1" level in the write mode. Control circuit 93 is made up of D type transistors TW11 to TW13, and E type transistor TW14. This circuit is configured like voltage output control circuit 84. The signal from output node N11 of NAND gate circuit 92 is applied to control circuit 93.

Decoders $90_2$ to $90_4$ are similarly configured. In decoder $90_3$, signals RA1 and $\overline{RA2}$ are used in place of address signals RA1 and RA2. In decoder $90_2$, signals $\overline{RA1}$ and RA2 are used in place of address signals RA1 and RA2. In decoder $90_1$, signals $\overline{RA1}$ and $\overline{RA2}$ are used in place of signals RA1 and RA2.

When row decoder 20 is constructed with a NAND type circuit, address signals RA1 and $\overline{RA2}$ are the same as the address signals applied when row decoder 20 selects row lines R1, R5, ..., Rm-3. Signals $\overline{RA1}$ and RA2 are the same as the address signals applied when row decoder 20 selects row lines R2, R6, ..., Rm-2. Signals RA1 and $\overline{RA2}$ are the same as the address signals applied when row decoder 20 selects row lines R3, R7, ..., Rm-1. Signals RA1 and RA2 are the same as the address signals applied when row decoder 20 selects row lines R4, R8, ..., Rm. If row decoder 20 is constructed with a NOR gate type circuit, it needs only to invert the phases of all of the address signals. That is to say, the address signals to select row lines R1, R5, ..., Rm-3 are RA1 and RA2, respectively.

With such an arrangement, when the memory device is in the read mode, signal R/$\overline{W}$ is set at high level, signal R/$\overline{W}$ at low level, and voltage VH at 5V. In the read mode, signal R/$\overline{W}$ is set at "0" level. Under this condition, transistors T14 in decoders $90_1$ to $90_4$ are all turned off. Node N11 is then set to "1" level. Therefore, transistors T14 of voltage output control circuits 93 in decoders $90_1$ to $90_4$ are turned on, so that signals H1 to H4 are "0" in level. In turn, selected transistors TWR11 to TWR14, TWR21 to TWR24, ..., TWRi1 to TWRi4 are all turned off, so that lines R1 to Rm are selectively driven by the output signal of row decoder 20.

In the write mode, since signal R/$\overline{W}$ is "1" in level, transistors T14 in decoders $90_1$ to $90_4$ are all turned on. At this time, if one row line R4 is selected, transistors T12 and T13 are both in an on state. Transistors T12 and T13 contained in decoder $90_4$ are supplied with row address signals RA1 and RA2 same as those supplied to row decoder 20 when row line R4 is selected. As a result, only the signal at output node N11 of NAND gate circuit 92 in decoder $90_4$ is set to "0" level. In turn transistor TW12 in voltage output control circuit 93 is turned on, and signal H4 is set to "1" level. Further, the gate of transistor TW11 is substantially 0V. Therefore, if the absolute value of the threshold voltage of transistor TW11 is smaller than voltage Vc, transistor TW11 is turned off. High voltage VH is applied to output node N12 through transistors TW12 and TW13. At this time, either of transistors T12 and T13 is turned off in each of decoders $90_1$ to $90_3$. The signal at output node N11 of NAND gate circuit 92 is set to "1" level, so that transistor TW14 is turned on. Therefore, signals H1 to H3 are all in "0" level. By this time, in decoder $90_1$ to $90_3$, high voltage VH has been applied to transistor TW12. If conductance gm of transistor TW11 is set to be satisfactorily larger than that of transistor TW13, node N13 between transistors TW11 and TW12 is set at about voltage Vc and the gate of transistor TW12 is at about 0V. Therefore, if the threshold voltage of the D type transistor is smaller than voltage Vc, the D type transistor is turned off. In decoders $90_1$ to $90_3$, no current is caused by high voltage VH in voltage output control circuit 93.

When signal H4 is set at a high voltage, only selected transistors TWR14, TWR24, . . . , TWRi4, of which the gates are coupled with signal H4, are turned on. Under this condition, of selected transistors TWR11 to TWR14, transistors TWR11 to TWR13 are turned off and disconnected from boosted voltage distribution circuit 72R1. Only row line R4 remains connected to boosted voltage distribution circuit 72R1. In circuit 72R1, by the signal of "1" level in row line R4, transistor TW5 is turned off. As a result, the gate of transistor TW2 is set in "0" level. At the same time, transistor TW1 is turned on. Transistor TW2 is turned off, so that high voltage VH is applied to node N20, coupled with the gate of transistor TW5, through transistors TW1 and TW3. Then, row line R4 is charged up to high voltage VH.

Of row lines R5 through R8, for example, lines R5 to R7 are disconnected from boosted voltage distribution circuit 72R2 by select transistors TWR21 to TWR23. Only row line R8 is connected, through transistor TWR24, to distribution circuit 72R2. Because, row line R8 has not been selected by row decoder 20, it is set in "0" level, and no high voltage is applied to it from distribution circuit 72R2. The same thing is true for other groups of other four row lines (for example, a group of row lines R1 through R4). Consequently, no current is caused by the high voltage in distribution circuits 72R2 to 72Ri.

Subsequently, data is written into a memory cell at the intersecting point of the column line (not shown) which is placed in a select state and row line R4 to which high voltage VH is selectively applied. The written data is retained in the cell unless it is erased.

As described above, in the prsent embodiment, one boosted voltage distribution circuit is provided for each group of four row lines R1 through R4, R5 through R8, . . . and Rm-3 through Rm. Similarly, one boosted voltage distribution circuit is provided for each of four column select line groups C1 through C4 and C5 through C8, . . . . Therefore, the number of the boosted voltage distribution circuits can be reduced to one quarter that of the conventional memory device. In this embodiment, four decoder 90 are additionally provided. However, in general EPROMs, the number of row lines R is extremely large, and hence the number of distribution circuits is considerably large. For this reason, the number of circuit elements is considerably reduced for the entire memory device. This indicates that the memory device, when fabricated into an integrated circuit, requires a reduced size of the chip.

Figure 6:
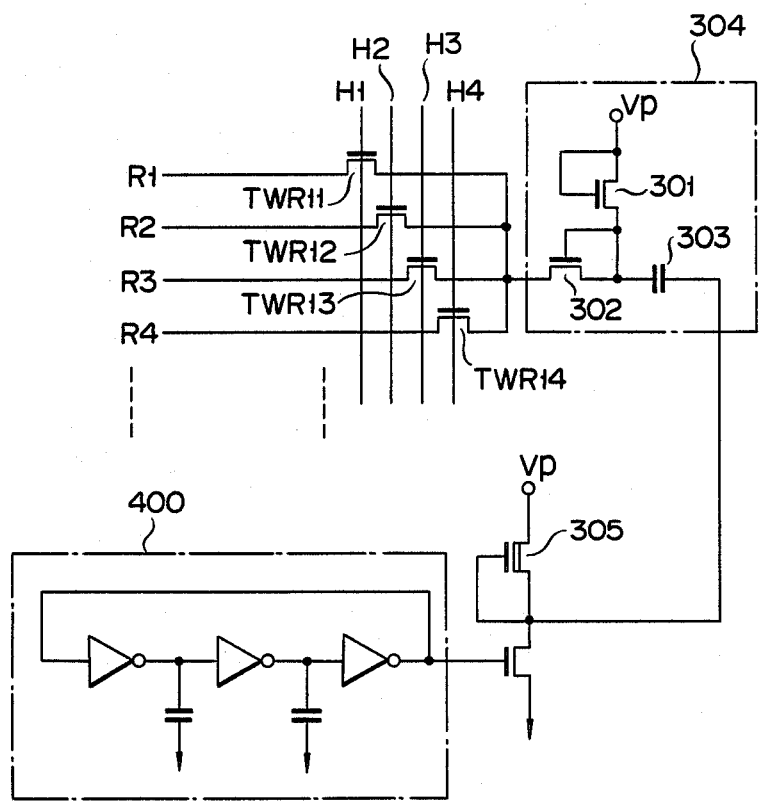
FIG. 6 is a diagram of a modification of a boosted voltage distributing circuit of the EPROM shown in FIGS. 5A to 5D.
Figure 7A:
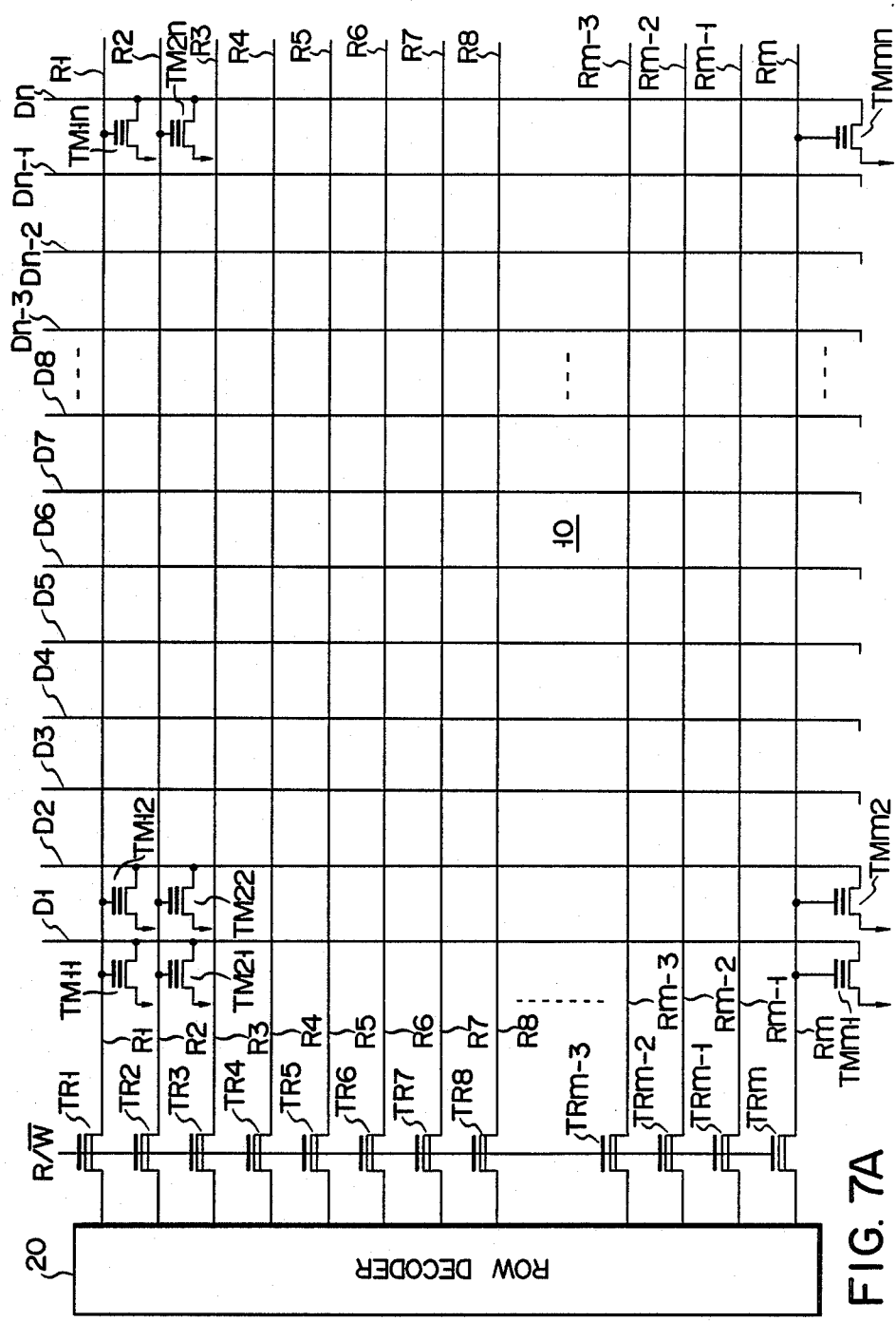
Figure 7C:
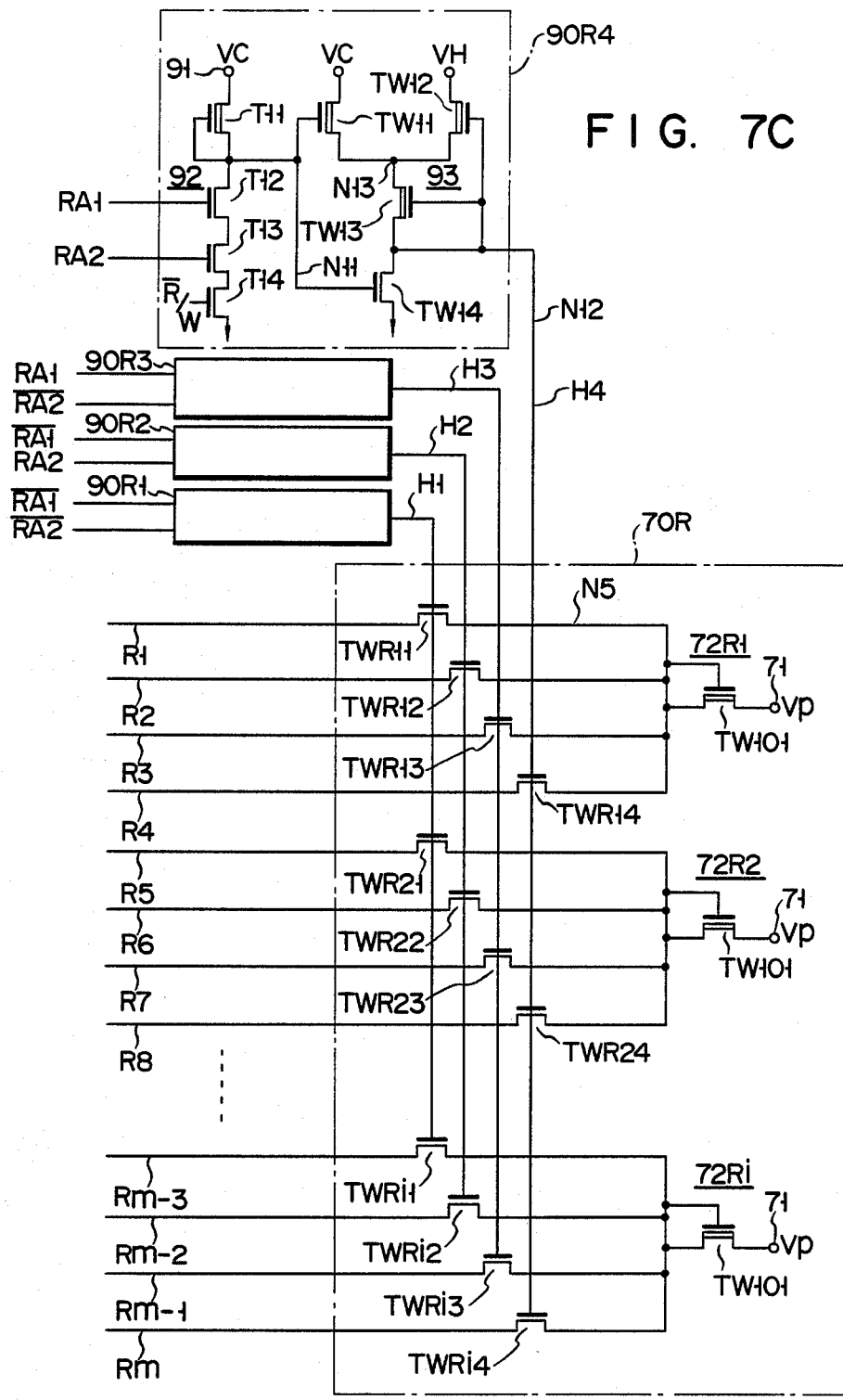
Figure 7D:
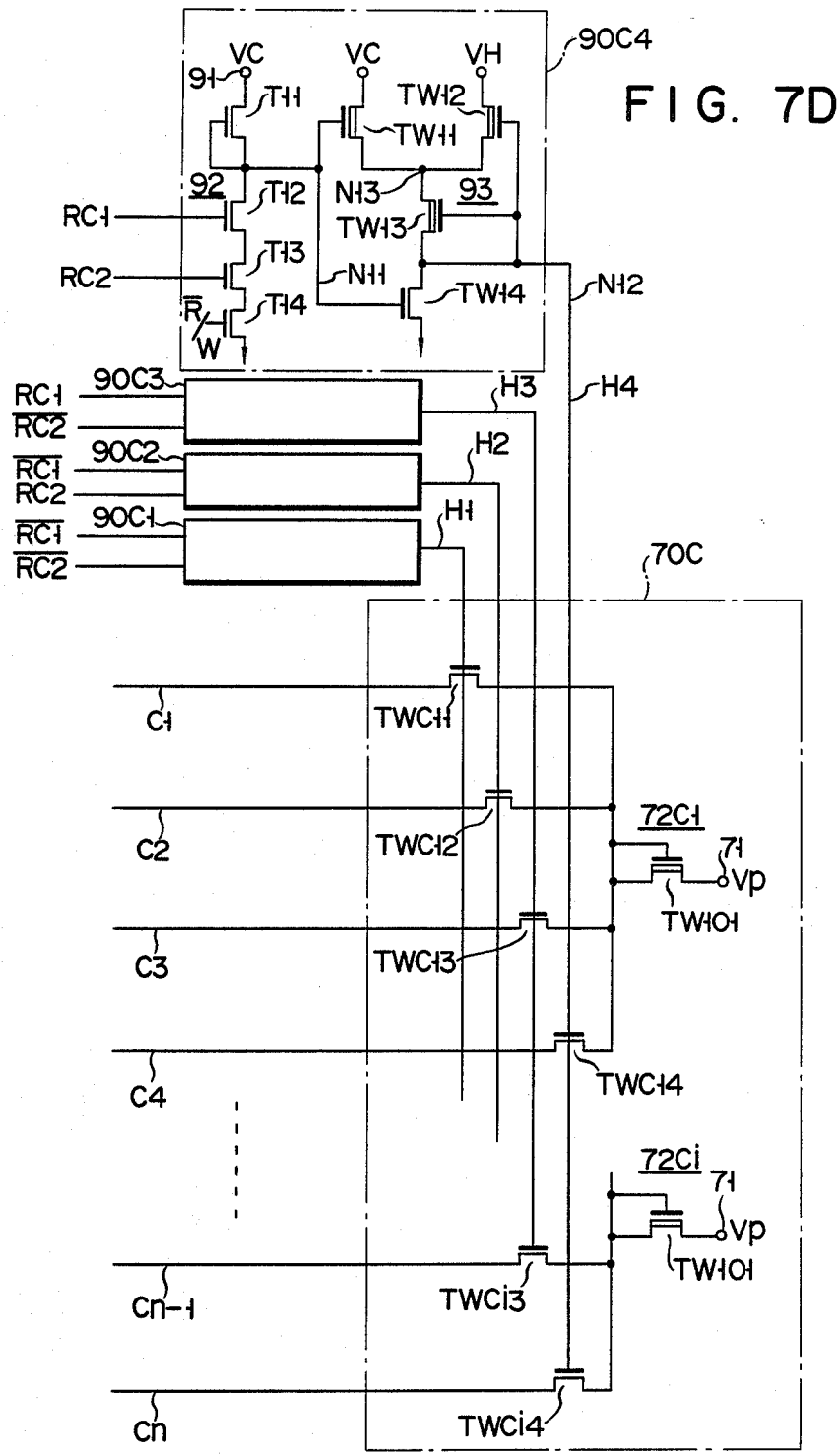

FIG. 6 shows a modification of distribution circuit 72R in the device of FIGS. 5A to 5D. In this modified circuit, voltage boost circuit 304 is used in place of circuit 72R. Circuit 304 is comprised of E type transistors 301 and 302 and capacitor 303. Circuit 304 is provided for each four row line group. One end of capacitor 303 is coupled with the output signal of oscillator 400 through inverter 305 which is supplied with high voltage Vp.

In such a circuit arrangement, the output signal of oscillator 400 is converted into signal $\phi$ of high voltage Vp by inverter 305, and is fed to one end of capacitor 303 in boost circuit 304. In circuit 304, voltage Vp as applied through transistor 301 and through the capacitive coupling of capacitor 303 is boosted. The boosted voltage is rectified by transistor 302 and supplied to one row line R.

FIGS. 7A to 7D show a semiconductor memory device according to another embodiment of the invention. In this embodiment, the structure of boosted voltage distributing circuits 72R to 72C are different from those in the device of FIGS. 5A to 5D. Others are substantially the same as those in the device of FIGS. 5A to 5D.

In the embodiment of FIGS. 7A to 7D, boosted voltage distributing circuit 72R1 comprises power source terminal 71 to which write voltage Vp is applied, D type MOS transistor TW101 whose drain is connected to power source terminal 71, E type MOS transistors TWR11 to TWR14 whose drains are connected to the source of MOS transistor TW101 and whose sources are connected to row lines R1 to R4. Other boosted voltage distributing circuits 72R2, 72R3, . . . , and 72Ri have substantially the same construction as that of boosted voltage distributing circuits 72R1. That is, boosted voltage distributing circuits 72R2 comprises power source terminal 71 to which write voltage Vp is applied, D type MOS transistor TW101 whose drain is connected to power source terminal 71, E type MOS transistors TWR21 to TWR24 whose drains are connected to the source of MOS transistor TWR101 and whose sources are connected to row lines R5 to R8. Boosted voltage distributing circuits 72Ri comprises power source terminal 71 to which write voltage Vp is applied, D type MOS transistor TW101 whose drain is connected to power source terminal 71, E type MOS transistors TWRi1 to TWRi4 whose drains are connected to the source of MOS transistor TW101 and whose sources are connected to row lines Rm3 to RM.

Boosted voltage distributing circuit 72C1 comprises power source terminal 71 to which write voltage Vp is applied, D type MOS transistor TW101 whose drain is connected to power source terminal 71, E type MOS transistors TWRC11 to TWRC14 whose drains are connected to the source of MOS transistor TW101 and whose sources are connected to column select lines C1 to C4. Other boosted voltage distributing circuits 72C are substantially the same construction as that of boosted voltage distributing circuits 72C1 and the descriptions are omitted.

With the device of FIGS. 7A to 7D, when the memory device is in the read mode, signal R/$\overline{\text{W}}$ is set to high level, signal $\overline{R/W}$ to low level, and voltage VH to 5V. In the read mode, signal $\overline{R/W}$ is set to "0" level. Under this condition, transistors T14 in decoders $90_1$ to $90_4$ are all turned off. Node N11 is then set to "1" level. Therefore, transistors T14 of voltage output control circuits 93 in decoders $90_1$ to $90_4$ are turned on, so that signals H1 to H4 are "0" in level. In turn, selected transistors TWR11 to TWR14, TWR21 to TWR24, . . . , TWRi1 to TWRi4 are all turned off, so that lines R1 to Rm are selectively driven by the output signal of row decoder 20.

In the write mode, since signal $R/\overline{W}$ is "1" in level, transistors T14 in decoders $90_1$ to $90_4$ are all turned on. At this time, if one row line R4 is selected, transistors T12 and T13 are both in an on state. The transistors T12 and T13 contained in decoder $90_4$ are supplied with row address signals RA1 and RA2 same as those supplied to row decoder 20 when row line R4 is selected. As a result, only the signal at output node N11 of NAND gate circuit 92 in decoder $90_4$ is set to "0" level. In turn, transistors TW11 and TW14 in voltage output control circuit 93 is turned off, and signal H4 is set to "1" level (VH). At this time, either of transistors T12 and T13 is turned off in each of decoders $90_1$ to $90_3$. The signal at output node N11 of NAND gate circuit 92 is set to "1" level, so that transistor TW14 is turned on. Therefore, signals H1 to H3 are all in "0" level.

When signal H4 is set at a high voltage, only selected transistors TWR14, TWR24, . . . , TWRi4, of which the gates are coupled with signal H4, are turned on. Under this condition, of selected transistors TWR11 to TWR14, transistors TWR11 to TWR13 are turned off and disconnected from load transistor TW101. Only row line R4 remains connected to load transistor TW101, so that write voltage Vp is supplied to row line R4.

Of four row lines R5 to R8, for example, lines R5 to R7 are disconnected from load resistors TW101 in boosted voltage distribution circuit 72R2 by select transistors TWR21 to TWR23. Only row line R8 is connected, through transistor TWR24, to distribution circuit 72R2. By this time, row line R8 has not been selected by row decoder 20, it is set in "0" level. The same thing is true for other groups of other four row lines (for example, a group of row lines R1 through R4).

Subsequently, data is written into a memory cell at the intersecting point of the column line which is placed in a select state, and row line R4 to which write voltage Vp is selectively applied. The written data is retained in the cell unless it is erased.

Figure 8:
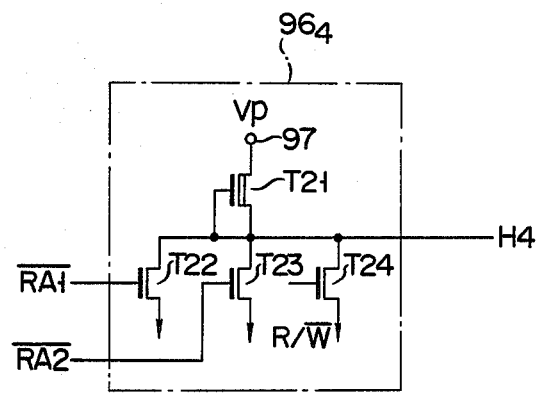
FIG. 8 is a diagram of a modification of a decoder in the EPROM of FIGS. 7A to 7D.

FIG. 8 shows a modification of the decoder $90_4$ in the device of FIGS. 7A to 7D. The modified circuit $96_4$ is of NOR gate type and comprises D type MOS transistor T21 and E type MOS transistors T21 to T24. Transistors T21 and T23 are inserted in series between write voltage terminal 97, to which write voltage Vp is applied, and ground. Transistors T22 and T24 are connected in parallel to transistor T23. The gates of transistors T22 and T23 are inputted with row address signals RA1 and RA2, respectively. The gate of transistor T24 is inputted with read/write control signal $R/\overline{W}$. A high voltage H4 is taken out at the common node of transistor T22 to T24.

It should be understood that the present invention is not limited to the above-mentioned embodiment, but can variously be modified and changed within the spirit of the invention. For example, three bits row address signals may be used. In such a case, eight row and/or column select lines are gathered into a single group of lines. One distribution circuit is provided for each group of lines. Further, the distribution circuits are applicable for only one of the row and column lines.

As described above, the present invention can provide the EPROM and EEPROM of which chip size is smaller than that of the conventional one when the memory device of the invention is fabricated by the IC technology.

What is claimed is:

1. A programmable semiconductor memory device comprising:
   a plurality of row lines;
   a plurality of column lines crossing said plurality of row lines to define intersections therebetween;
   a memory array comprising a plurality of memory cells, said plurality of memory cells being located on said intersections;
   a plurality of column select transistors coupled one between each said column line and a node;
   a plurality of column select lines each connected to a control electrode of a corresponding one of said column select transistors;
   a column decoder for selecting said column select lines;
   a row decoder for selecting said row lines;
   a plurality of high voltage supply circuits;
   a plurality of two terminal switch elements divided into a plurality of groups, with one terminal of each said switch element connected to a corresponding one of said row lines and with the other terminal of each switch element in a group connected to a corresponding one of said high voltage supply circuits; and
   a supplemental decoder for selecting the switch element connected to a row line selected by said row decoder, to turn said selected switch element on so that said selected row line is supplied with a high voltage from the high voltage supply circuit corresponding to the group which includes said selected switch element.

2. A nonvolatile semiconductor memory device according to claim 1, in which each of said high voltage supply circuits comprises first, second, third, fourth and fifth transistors, one terminal of the source-drain path of said first transistor being connected to a high voltage power source and the gate thereof being connected to said other terminal of a switch element in a corresponding one of said groups, one terminal of the source-drain path of said second transistor being connected to a first power source voltage, one terminal of the source-drain path of said third transistor being connected to the other terminals of the source-drain paths of said first and second transistors, the other terminal of the source-drain path of said third transistor and the gate thereof being connected to said terminal of said switch element, one terminal of the source-drain path of said fourth transistor being connected to said first power source voltage, the other terminal of the source-drain path of said fourth transistor being connected at a node to one terminal of the source-drain path of said fifth transistor, the other terminal of the source-drain path of said fifth transistor being connected to a second power source voltage, the gate of said fourth transistors and said node of said fourth and fifth transistors being connected to the gate of said second transistor, and the gate of said fifth transistor being connected to said other terminal of said switch element.

3. A nonvolatile semiconductor memory device according to claim 1, in which each of said high voltage supply circuits comprises first and second transistors and a capacitor, one terminal of the source-drain path of said first transistor and the gate thereof being connected to a high voltage power source, one terminal of the source-drain path of said second transistor being connected to said other terminal of a switch element in a corresponding one of said groups, the other terminal of the source-drain path of said second transistor and the gate thereof being connected to the other terminal of the source-drain path of said first transistor and one terminal of said capacitor, and the other terminal of said capacitor being connected to said high voltage power source.

4. A programmable semiconductor memory device comprising:
   a plurality of row lines;
   a plurality of column lines crossing said plurality of row lines to define intersections therebetween;
   a memory array comprising a plurality of memory cells, said plurality of memory cells being located on said intersections;
   a plurality of column select transistors coupled one between each said column line and a node;
   a plurality of column select lines each connected to a control electrode of a corresponding one of said column select transistors;
   a column decoder for selecting said column select lines;
   a row decoder for selecting said row lines;
   a plurality of high voltage supply circuits;
   a plurality of two terminal switch elements divided into a plurality of groups, with one terminal of each said switch element connected to a corresponding one of said column select lines and with the other terminal of each switch element in a group connected to a corresponding one of said high voltage supply circuits; and
   a supplemental decoder for selecting the switch element connected to the column select line selected by said column decoder, to turn said selected switch element on so that said selected column select line is supplied with a high voltage from the high voltage supply circuit corresponding to the group which includes said selected switch element.

5. A nonvolatile semiconductor memory device according to claim 4, in which each of said high voltage supply circuits comprises first, second, third, fourth and fifth transistors, one terminal of the source-drain path of said first transistor being connected to a high voltage power source and the gate thereof being connected to said other terminal of a switch element in a corresponding one of said groups, one terminal of the source-drain path of said second transistor being connected to a first power source voltage, one terminal of the source-drain path of said third transistor being connected to the other terminals of the source-drain paths of said first and second transistors, the other terminal of the source-drain path of said third transistor and the gate thereof being connected to said terminal of said switch element, one terminal of the source-drain path of said fourth transistor being connected to said first power source voltage, the other terminal of the source-drain path of said fourth transistor being connected at a node to one terminal of the source-drain path of said fifth transistor, the other terminal of the source-drain path of said fifth transistor being connected to a second power source voltage, the gate of said fourth transistors and said node of said fourth and fifth transistors being connected to the gate of said second transistor, and the gate of said fifth transistor being connected to said other terminal of said switch element.

6. A nonvolatile semiconductor memory device according to claim 4, in which each of said high voltage supply circuits comprises first and second transistors and a capacitor, one terminal of the source-drain path of said first transistor and the gate thereof being connected to a high voltage power source, one terminal of the source-drain path of said second transistor being connected to said other terminal of a switch element in a corresponding one of said groups, the other terminal of the source-drain path of said second transistor and the gate thereof being connected to the other terminal of the source-drain path of said first transistor and one terminal of said capacitor, and the other terminal of said capacitor being connected to said high voltage power source.

7. A programmable semiconductor memory device comprising:
   a plurality of row lines;
   a plurality of column lines crossing said plurality of row lines to define intersections therebetween;
   a memory array comprising a plurality of memory cells, said plurality of memory cells being located on said intersections;
   a plurality of column select transistors coupled one between each said column line and a node;
   a plurality of column select lines each connected to a control electrode of a corresponding one of said column select transistors;
   a column decoder for selecting said column select lines;
   a row decoder for selecting said row lines;
   a plurality of first and second high voltage supply circuits;
   a plurality of two terminal first switch elements divided into a plurality of groups, with one terminal of each said first switch element connected to a corresponding one of said row lines and with the other terminal of each first switch element in a group connected to a corresponding one of said first high voltage supply circuits;
   a first supplemental decoder for selecting the first switch element connected to the row line selected by said row decoder, to turn said selected first switch element on so that said selected row line is supplied with a high voltage from the first high voltage supply circuit corresponding to the group which includes said selected first switch element;
   a plurality of two terminal second switch elements divided into a plurality of groups, with one terminal of each said second switch element connected to a corresponding one of said row lines and with the other terminal of each second switch element in a group connected to a corresponding one of said second high voltage supply circuits; and
   a second supplemental decoder for selecting the second switch element connected to the row line selected by said row decoder, to turn said selected second switch element on so that the selected row line is supplied with a high voltage from the second high voltage supply circuit corresponding to the group which includes said selected second switch element.

8. A nonvolatile semiconductor memory device according to claim 7, in which each of said first and second high voltage supply circuits comprises first, second, third, fourth and fifth transistors, one terminal of the source-drain path of said first transistor being connected to a high voltage power source and the gate thereof being connected to said other terminal of a switch element in a corresponding one of said groups, one terminal of the source-drain path of said second transistor being connected to a first power source voltage, one terminal of the source-drain path of said third transistor being connected to the other terminals of the source-drain paths of said first and second transistors, the other terminal of the source-drain path of said third transistor and the gate thereof being connected to said terminal of said switch element, one terminal of the source-drain path of said fourth transistor being connected to said first power source voltage, the other terminal of the source-drain path of said fourth transistor being connected at a node to one terminal of the source-drain path of said fifth transistor, the other terminal of the source-drain path of said fifth transistor being connected to a second power source voltage, the gate of said fourth transistors and said node of said fourth and fifth transistors being connected to the gate of said second transistor, and the gate of said fifth transistor being connected to said other terminal of said switch element.

9. A nonvolatile semiconductor memory device according to claim 7, in which each of said first and second high voltage supply circuits comprises first and second transistors and a capacitor, one terminal of the source-drain path of said first transistor and the gate thereof being connected to a high voltage power source, one terminal of the source-drain path of said second transistor being connected to said other terminal of a switch element in a corresponding one of said groups, the other terminal of the source-drain path of said second transistor and the gate thereof being connected to the other terminal of the source-drain path of said first transistor and one terminal of said capacitor, and the other terminal of said capacitor being connected to said high voltage power source.

* * * * *

UNITED STATES PATENT AND TRADEMARK OFFICE
CERTIFICATE OF CORRECTION

PATENT NO. : 4,805,150
DATED : February 14, 1989
INVENTOR(S) : Masamichi Asano et al.

It is certified that error appears in the above-identified patent and that said Letters Patent is hereby corrected as shown below:

Title page:

At [75], change "Inventors: Masami Asano, Tokyo; Hiroshi Iwahashi, Yokohama, both of Japan"

to --Masamichi Asano, Tokyo; Hiroshi Iwahashi, Yokohama, both of Japan--

Signed and Sealed this

Seventeenth Day of October, 1989

Attest:

DONALD J. QUIGG

*Attesting Officer*  *Commissioner of Patents and Trademarks*